United States Patent
Lin et al.

(10) Patent No.: US 12,068,259 B2
(45) Date of Patent: *Aug. 20, 2024

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Wei Da Lin, Kaohsiung (TW); Meng-Jen Wang, Kaohsiung (TW); Hung Chen Kuo, Kaohsiung (TW); Wen Jin Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/121,568

(22) Filed: Mar. 14, 2023

(65) Prior Publication Data
US 2023/0223354 A1  Jul. 13, 2023

Related U.S. Application Data

(63) Continuation of application No. 16/852,256, filed on Apr. 17, 2020, now Pat. No. 11,605,598.

(51) Int. Cl.
*H01L 23/552* (2006.01)
*H01L 21/3213* (2006.01)
(Continued)

(52) U.S. Cl.
CPC ...... *H01L 23/552* (2013.01); *H01L 21/32131* (2013.01); *H01L 21/561* (2013.01);
(Continued)

(58) Field of Classification Search
CPC ... H01L 23/552; H01L 23/04; H01L 23/3114; H01L 21/32131; H01L 21/561; H01L 21/563; H01L 21/565
See application file for complete search history.

(56) References Cited

U.S. PATENT DOCUMENTS

| | | | |
|---|---|---|---|
| 6,376,915 B1 | 4/2002 | Hikita et al. | |
| 10,242,953 B1 * | 3/2019 | Yenrudee | H01L 23/49513 |

(Continued)

FOREIGN PATENT DOCUMENTS

| JP | 4650244 B2 | 3/2011 |
|---|---|---|

OTHER PUBLICATIONS

Final Office Action for U.S. Appl. No. 16/852,256, issued Sep. 2, 2022, 13 pages.

(Continued)

*Primary Examiner* — Marc Anthony Armand
(74) *Attorney, Agent, or Firm* — FOLEY & LARDNER LLP

(57) ABSTRACT

A semiconductor device package includes a substrate having a surface, a conductive element disposed on the surface of the substrate, and an encapsulant disposed on the surface of the substrate and covering the conductive element. The conductive element has an upper surface facing away from the substrate and exposed from the encapsulant. Further, a roughness of the upper surface of the conductive element is greater than a roughness of a side surface of the conductive element.

9 Claims, 8 Drawing Sheets

(51) Int. Cl.
   *H01L 21/56* (2006.01)
   *H01L 23/04* (2006.01)
   *H01L 23/31* (2006.01)

(52) U.S. Cl.
   CPC .......... *H01L 21/563* (2013.01); *H01L 21/565* (2013.01); *H01L 23/04* (2013.01); *H01L 23/3114* (2013.01)

(56) References Cited

U.S. PATENT DOCUMENTS

| | | |
|---|---|---|
| 2016/0276290 A1 | 9/2016 | Yamada et al. |
| 2017/0294387 A1* | 10/2017 | Kawabata ............. H01L 21/485 |
| 2018/0033738 A1* | 2/2018 | Kawabata ......... H01L 23/49838 |
| 2018/0197821 A1* | 7/2018 | Shin ..................... H01L 23/552 |
| 2019/0051611 A1* | 2/2019 | Kim .................... H01L 23/3128 |
| 2022/0020698 A1* | 1/2022 | Kim ........................ H01L 24/73 |

OTHER PUBLICATIONS

Notice of Allowance for U.S. Appl. No. 16/852,256, issued Nov. 10, 2022, 11 pages.

Non-Final Office Action for U.S. Appl. No. 16/852,256, issued Feb. 24, 2022, 14 pages.

* cited by examiner

SEMICONDUCTOR DEVICE PACKAGE AND METHOD OF MANUFACTURING THE SAME

CROSS-REFERENCE TO RELATED APPLICATION

This application is a continuation of U.S. patent application Ser. No. 16/852,256 filed Apr. 17, 2020, now issued as U.S. Pat. No. 11,605,598, the contents of which is incorporated herein by reference in its entirety.

BACKGROUND

1. Field of the Disclosure

The instant disclosure relates to, amongst other things, a semiconductor device package and method of manufacturing the same.

2. Description of Related Art

In response to the demand for increased processing speed and reduced device size, semiconductor devices have become increasingly complicated. In smaller, lighter weight, and higher frequency electronic devices, transitions between signal levels are more frequent, creating stronger electromagnetic emissions. Performance of semiconductor devices in an electronic device can be negatively affected by electromagnetic emissions from other semiconductor devices in the same electronic device. The risk of such electromagnetic interference (EMI) increases as the density of semiconductor devices in a given electronic device increases.

SUMMARY

According to one example embodiment of the instant disclosure, a semiconductor device package includes a substrate having a surface, a conductive element disposed on the surface of the substrate, and an encapsulant disposed on the surface of the substrate and covering the conductive element. The conductive element has an upper surface facing away from the substrate and exposed from the encapsulant. Further, a roughness of the upper surface of the conductive element is greater than a roughness of a side surface of the conductive element.

According to another example embodiment of the instant disclosure, a semiconductor device package includes a substrate having a surface, a conductive element disposed on the surface of the substrate, and an encapsulant disposed on the surface of the substrate and covering the conductive element. The conductive element has an upper surface facing away from the substrate and exposed from the encapsulant. The encapsulant includes a plurality of fillers. Further, the encapsulant has a first portion and a second portion. The first portion and the second portion are at a same elevation, and the first portion is closer to a side surface of the conductive element than the second portion. A relative percent difference between a density of the fillers in the first portion of the encapsulant and a density of the fillers in the second portion of the encapsulant ranges is less than 25%.

According to another example embodiment of the instant disclosure, a method of manufacturing a semiconductor device package includes: providing a substrate having a conductive element disposed on a surface of the substrate, wherein the conductive element having an upper surface faces away the substrate; carrying out a compression molding process to dispose an encapsulant on the surface of the substrate to cover the conductive element, wherein the upper surface of the conductive element contacts a release film during the compression molding process; and removing the release film.

In order to further understanding of the instant disclosure, the following embodiments are provided along with illustrations to facilitate appreciation of the instant disclosure; however, the appended drawings are merely provided for reference and illustration, and do not limit the scope of the instant disclosure.

DETAILED DESCRIPTION

Figure 1A:
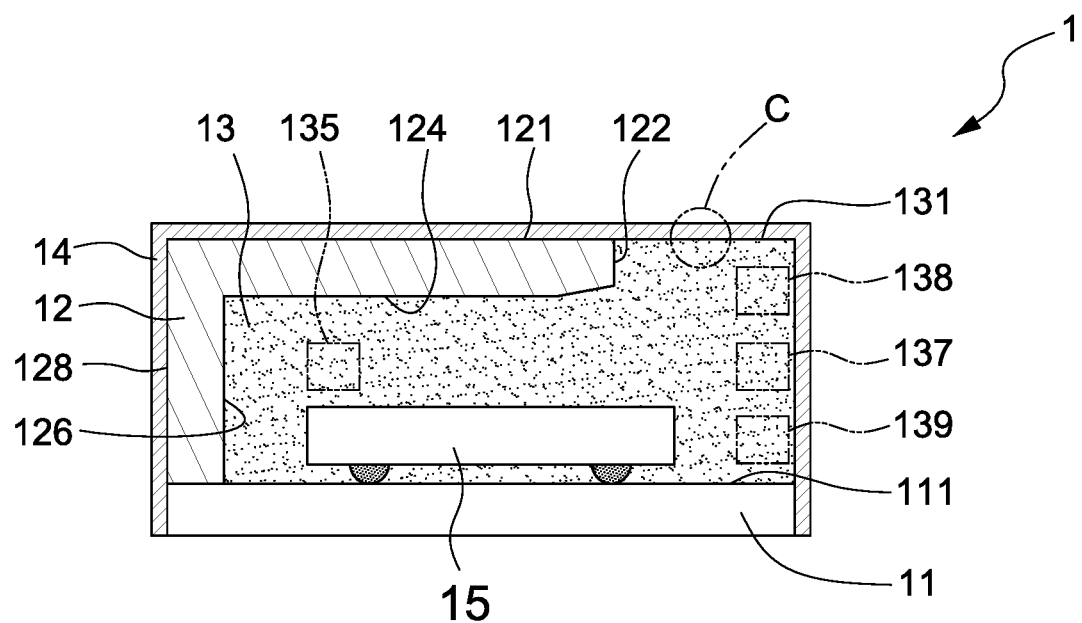
FIG. 1A is a cross-sectional view of a semiconductor device package in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Present disclosure provides a semiconductor device package with a conductive element made of, or covered by, a conductive material. The conductive element may function as a petition to separate neighboring compartments and may also function as a fence or barrier between neighboring compartments so as to reduce electromagnetic interference (EMI) among neighboring devices.

FIG. 1A is a cross-sectional view of a semiconductor device package 1 in accordance with some embodiments of the present disclosure. As shown in FIG. 1A, the semiconductor device package 1 includes a substrate 11, a semiconductor device 15, a conductive element 12 and an encapsulant 13. In some embodiments, the substrate 11 may be a core substrate or a core-less substrate. The substrates may include traces, pads or interconnections (not shown) for electrical connection. The substrate 11 has a surface 111 (e.g., an upper surface), and the conductive element 12 and the semiconductor device 15 are disposed or mounted on the surface 111 of the substrate 11.

The conductive element 12 may be made of, or covered by, a conductive material. In some embodiments, the conductive element 12 may be a lid, e.g., a metal lid. In some embodiments, the conductive element 12 may function as a petition to separate neighboring compartments and may also function as a fence or barrier between neighboring compartments so as to reduce electromagnetic interference (EMI) among neighboring devices. In some embodiments, the conductive element 12 may be electrically connected to a ground pad or circuit of the substrate 11. Further, in some embodiments, the conductive element 12 may extend laterally from an end distal to the substrate 11 and forms a lateral extension portion covering the semiconductor device 15 or a portion of the semiconductor device 15.

The semiconductor device 15 may be a die, an active device, a passive device, or other electronic devices. The semiconductor device 15 may electrically connected to the substrate 11 via flip-chip bonding or wire bonding.

The encapsulant 13 is disposed on the surface 111 of the substrate 11. The encapsulant (i.e., package body) 13 may encapsulate or cover the surface 111 of the substrate 11, the semiconductor device 15 and the conductive element 12 and expose an upper surface 121 of the conductive element 12. The encapsulant 13 may fill in the compartment and encapsulate or cover a side surface (i.e., 122, 126) of the conductive element 12 and a lower surface 124 of the lateral extension portion of the conductive element 12. The encapsulant 13 may include molding compounds, such as a Novolac-based resin, an epoxy-based resin, a silicone-based resin, or other another suitable encapsulant; fillers such as silicon oxide fillers, may be included in the molding compound. In addition, the encapsulant 13 may include a molding underfill (MUF) or a capillary underfill (CUF).

The semiconductor device 1 may further include a shielding layer 14. The shielding layer 14 may cover or contact the encapsulant 13 and the upper surface 121 of the conductive element 12. In some embodiments, the shielding layer 14 may also cover or contact the side surface 128 of the conductive element 12. In some embodiments, the shielding layer may cover or contact the substrate 11. The shielding layer 14 may be electrically connected to a ground pad or circuit of the substrate 11. The shielding layer 14 may provide conformal shielding. The shielding layer may be formed, deposited or applied by chemical vapor deposition (CVD), electroless plating, sputtering, printing, spraying, vacuum deposition, or any other techniques. The shielding layer may be made of aluminum, copper, tin, chromium, gold, silver, nickel or any other metal or alloy.

As shown in FIG. 1A, in some embodiments, an upper surface 131 of the encapsulant 13 connects to the upper surface 121 of the conductive element 12. In other words, the upper surface 121 of the conductive element 12 is at an elevation substantially the same as an elevation of the upper surface 131 of the encapsulant 13. Further, the encapsulant 13 includes a first portion 135 and a second portion 137, the first portion 135 and the second portion 137 are at a same elevation, and the first portion 135 is closer to the side surface 126 of the conductive element 12 than the second portion 137. The distribution of the fillers at the same elevation is substantially uniform. In some embodiments, an amount of the fillers per unit volume in the first portion 135 is X1 and an amount of the fillers per unit volume in the second portion 137 is X2. In some embodiments, the difference between X1 and X2 divided by the average value of X1 and X2 (i.e., $|X1-X2|/avg(X1, X2)$) is less than 25% (for example, 22%, 20%, 18%, 15%, 12%, 10%, or less). In some embodiments, the difference between X1 and X2 divided by the average value of X1 and X2 may range from 15% to 20%. In some embodiments, an amount of the fillers within a unit cross-section area of the first portion 135 is X3 and an amount of the fillers within a unit cross-section area of the second portion 137 is X4. In some embodiments, the difference between X3 and X4 divided by the average value of X3 and X4 (i.e., $|X3-X4|/avg(X3, X4)$) is less than 25% (for example, 22%, 20%, 18%, 15%, 12%, 10%, or less). In some embodiments, the difference between X1 and X2 divided by the average value of X1 and X2 may range from 15% to 20%. In other words, a relative percent difference between a density of the fillers in the first portion 135 and a density of the fillers in the second portion 137 (based on volume or area) is less than 25% (for example, 22%, 20%, 18%, 15%, 12%, 10%, or less) and may range from 15% to 20% in some embodiments. Moreover, a size of the filler which is adjacent to the upper surface 131 of the encapsulant 13 is greater than a size of the filler which is far away from the upper surface 131 of the encapsulant 13. In some embodiments, the encapsulant 13 further includes a third portion 138 and a fourth portion 139. The third portion 138 is adjacent to the upper surface 131 and the fourth portion 139 is far away from the upper surface 131. In other words, a distance between the upper surface 131 and the third portion 138 is smaller than a distance between the upper surface 131 and the fourth portion 139. An average size of the fillers in the third portion 138 is greater than an average size of the fillers in the fourth portion 139.

Referring to FIG. 1A, the side surface 122, the lower surface 124 and the side surface 126 of the conductive element 12 are encapsulated by the encapsulant 13. The upper surface 121 and the side surface 128 of the conductive element 12 are exposed from the encapsulant 13 and contact the shielding layer 14. In some embodiments, a roughness of the upper surface 121 of the conductive element 12 is greater than a roughness of the side surface 122 of the conductive element 12. In some embodiments, the roughness of the upper surface 121 of the conductive element 12 is greater than a roughness of the lower surface 124 of the conductive element 12. In some embodiments, the upper surface 121 of the conductive element 12 is greater than a roughness of the side surface 126 of the conductive element 12. In some embodiments, the upper surface 121 of the conductive element 12 is greater than a roughness of the side surface 128 of the conductive element 12.

Figure 1B:
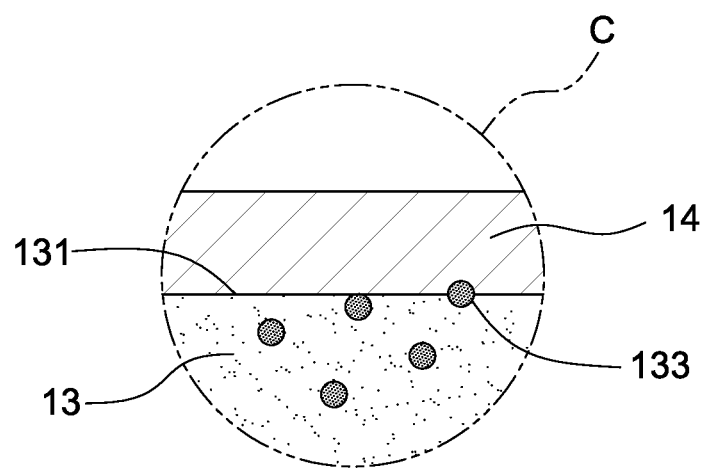
FIG. 1B is an enlarged view of portion "C" illustrated in FIG. 1A.

FIG. 1B is an enlarged view of portion "C" illustrated in FIG. 1A. As shown in FIG. 1B, the shielding layer 14 covers the encapsulant 13. Thus, the shielding layer 14 may be attached to the upper surface 131 of the encapsulant 13. In some embodiments, the encapsulant 13 includes a filler 133 protruding from an upper surface 131 of the encapsulant 13 and extending into the shielding layer 14.

Figure 2:
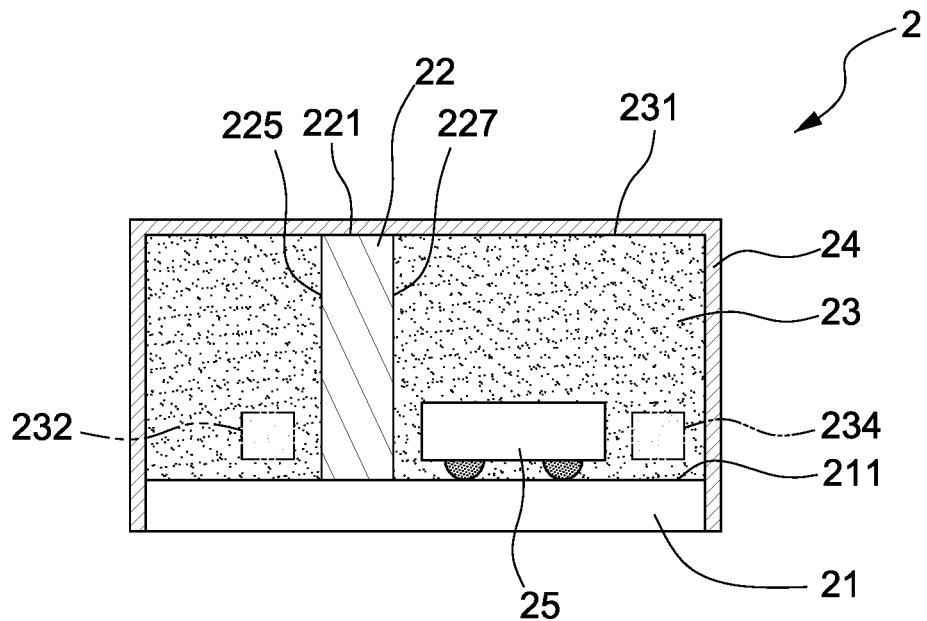
FIG. 2 is a cross-sectional view of a semiconductor device package in accordance with some embodiments of the present disclosure.

FIG. 2 is a cross-sectional view of a semiconductor device package 2 in accordance with some embodiments of the present disclosure. The semiconductor device package 2 of FIG. 2 has a structure similar to that of the semiconductor device package 1 of FIG. 1, except that FIG. 2 further illustrates the compartments separated by the conductive element and the conductive element of FIG. 2 does not have a lateral extension portion on a distal end.

As shown in FIG. 2, the semiconductor device package 2 includes a substrate 21, a semiconductor device 25, a conductive element 22 and an encapsulant 23. In some embodiments, the substrate 21 may be a core substrate or a core-less substrate. The substrates may include traces, pads or interconnections (not shown) for electrical connection. The substrate 21 has a surface 211 (e.g., an upper surface), and the conductive element 22 and the semiconductor device 25 are disposed or mounted on the surface 211 of the substrate 21.

The conductive element 22 may be made of, or covered by, a conductive material. In some embodiments, the conductive element 22 may be a lid, e.g., a metal lid. In some embodiments, the conductive element 22 may function as a petition to separate neighboring compartments and may also function as a fence or barrier between neighboring compartments so as to reduce electromagnetic interference (EMI) among neighboring devices. In some embodiments, the conductive element 22 may be electrically connected to a ground pad or circuit of the substrate 21.

The semiconductor device 25 may be a die, an active device, a passive device, or other electronic devices. The semiconductor device 25 may electrically connected to the substrate 21 via flip-chip bonding or wire bonding.

The encapsulant 23 is disposed on the surface 211 of the substrate 21. The encapsulant (i.e., package body) 23 may encapsulate or cover the surface 211 of the substrate 21, the semiconductor device 25, and side surfaces 225 and 227 of the conductive element 22. The encapsulant 23 may include molding compounds, such as a Novolac-based resin, an epoxy-based resin, a silicone-based resin, or other another suitable encapsulant; fillers such as silicon oxide fillers, may be included in the molding compound. In addition, the encapsulant 13 may include a molding underfill (MUF) or a capillary underfill (CUF).

As shown in FIG. 2, the conductive element 22 includes a side surface 225 and a side surface 227 opposite to the side surface 225. An upper surface 221 of the conductive element 22 is exposed from the encapsulant 23 and contacts the shielding layer 24, and the side surfaces 225 and 227 are covered or encapsulated by the encapsulant 23. In some embodiments, an upper surface 231 of the encapsulant 23 connects to the upper surface 221 of the conductive element 22. In other words, the upper surface 221 of the conductive element 22 is at an elevation substantially the same as an elevation of the upper surface 231 of the encapsulant 23. In some embodiments, a roughness of the upper surface 221 of the conductive element 22 is greater than a roughness of the side surface 225 of the conductive element 22. In some embodiments, a roughness of the upper surface 221 of the conductive element 22 is greater than a roughness of the side surface 227 of the conductive element 22.

Similar to the semiconductor device package 1, the distribution of the fillers at the same elevation in the same compartment is substantially uniform in the semiconductor device package 2. In addition, as shown in FIG. 2, the encapsulant 23 includes a first portion 232 facing the side surface 225 of the conductive element 22 and a second portion 234 facing the side surface 227 of the conductive element 22. That is, the first portion 232 and the second portion 234 of the encapsulant 23 are located, respectively, at two opposite sides of the conductive element 22 (i.e., in different compartment). The first portion 232 and the second portion 234 are at a same elevation, and a distance from the first portion 232 to the side surface 225 of the conductive element 22 is smaller than a distance of the second portion 234 to the side surface 227 of the conductive element 22. In some embodiments, an amount of the fillers per unit volume in the first portion 232 is Y1 and an amount of the fillers per unit volume in the second portion 234 is Y2. The difference between Y1 and Y2 divided by the average value of Y1 and Y2 (i.e., |Y1−Y2|/avg (Y1, Y2)) is less than 25% (for example, 22%, 20%, 18%, 15%, 12%, 10%, or less). In some embodiments, the difference between Y1 and Y2 divided by the average value of Y1 and Y2 may range from 15% to 20%. In some embodiments, an amount of the fillers within a unit cross-section area of the first portion 232 is Y3 and an amount of the fillers within a unit cross-section area of the second portion 234 is Y4. The difference between Y3 and Y4 divided by the average value of Y3 and Y4 (i.e., |Y3−Y4|/avg (Y3, Y4)) is less than 25% (for example, 22%, 20%, 18%, 15%, 12%, 10%, or less). In some embodiments, the difference between Y3 and Y4 divided by the average value of Y3 and Y4 may range from 15% to 20%. That is, a relative percent difference between a density of the fillers in the first portion 232 and a density of the fillers in the second portion 234 (based on volume or area) is less than 25% (for example, 22%, 20%, 18%, 15%, 12%, 10%, or less) and may range from 15% to 20%.

Figure 3A:
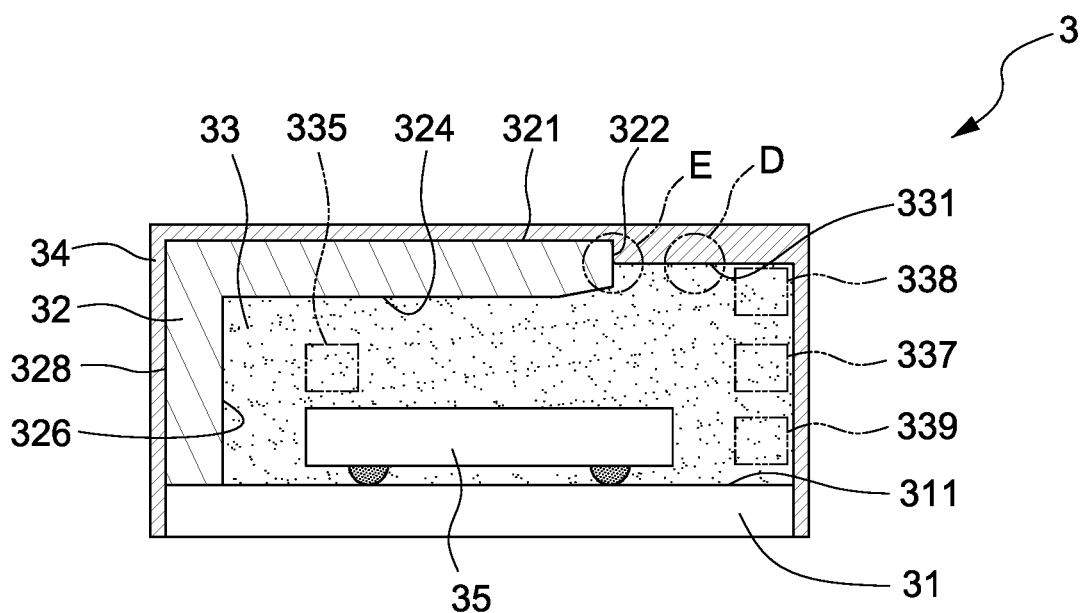
FIG. 3A is a cross-sectional view of a semiconductor device package in accordance with some embodiments of the present disclosure.

FIG. 3A is a cross-sectional view of a semiconductor device package 3 in accordance with some embodiments of the present disclosure. The semiconductor device package 3 of FIG. 3A has a structure similar to that of the semiconductor device package 1 of FIG. 1, except that a height of an upper surface of the encapsulant is lower than a height of an upper surface of the conductive element.

As shown in FIG. 3A, the semiconductor device package 3 includes a substrate 31, a semiconductor device 35, a conductive element 32 and an encapsulant 33. In some embodiments, the substrate 31 may be a core substrate or a core-less substrate. The substrates may include traces, pads or interconnections (not shown) for electrical connection. The substrate 31 has a surface 311 (e.g., an upper surface), and the conductive element 32 and the semiconductor device 35 are disposed or mounted on the surface 311 of the substrate 31.

The conductive element 32 may be made of, or covered by, a conductive material. In some embodiments, the conductive element 32 may be a lid, e.g., a metal lid. In some embodiments, the conductive element 32 may function as a petition to separate neighboring compartments and may also function as a fence or barrier between neighboring compartments so as to reduce electromagnetic interference (EMI) among neighboring devices. In some embodiments, the conductive element 32 may be electrically connected to a ground pad or circuit of the substrate 31. Further, in some embodiments, the conductive element 32 may extend laterally from an end distal to the substrate 31 and forms a lateral extension portion covering the semiconductor device 35 or a portion of the semiconductor device 35.

The semiconductor device 35 may be a die, an active device, a passive device, or other electronic devices. The semiconductor device 35 may electrically connected to the substrate 31 via flip-chip bonding or wire bonding.

The encapsulant 33 is disposed on the surface 311 of the substrate 31. The encapsulant (i.e., package body) 33 may encapsulate or cover the surface 311 of the substrate 31, the semiconductor device 35, and a portion of a side surface 322, a lower surface 324 and a side surface 326 of the conductive element 32. The encapsulant 33 may include molding compounds, such as a Novolac-based resin, an epoxy-based resin, a silicone-based resin, or other another suitable encapsulant; fillers such as silicon oxide fillers, may be included in the molding compound. In addition, the encapsulant 13 may include a molding underfill (MUF) or a capillary underfill (CUF).

As shown in FIG. 3A, the encapsulant 33 covers a portion of the side surface 322 of the conductive element 32. An upper surface 331 of the encapsulant 33 connects to the side surface 322 of the conductive element 32. The upper surface 331 of the encapsulant 33 is recessed with respect to the upper surface 321 of the conductive element 32. In other words, the upper surface 321 of the conductive element 32 is at an elevation higher than an elevation of the upper surface 331 of the encapsulant 33. Further, the encapsulant 33 includes a first portion 335 and a second portion 337, and the first portion 335 and the second portion 337 are at a same elevation and the first portion 335 is closer to the side surface 326 of the conductive element 32 than the second portion 337. The distribution of the fillers at the same elevation is substantially uniform. In some embodiments, an amount of the fillers per unit volume in the first portion 335 is Z1 and an amount of the fillers per unit volume in the second portion 337 is Z2. The difference between Z1 and Z2 divided by the average value of Z1 and Z2 (i.e., |Z1−Z2|/avg (Z1, Z2)) is less than 25% (for example, 22%, 20%, 18%, 15%, 12%, 10%, or less). In some embodiments, the difference between Z1 and Z2 divided by the average value of Z1 and Z2 may range from 15% to 20%. In some embodiments, an amount of the fillers within a unit cross-section area of the first portion 335 is Z3 and an amount of the fillers within a unit cross-section area of the second portion 337 is Z4. In some embodiments, the difference between Z3 and Z4 divided by the average value of Z3 and Z4 (i.e., |Z3−Z4|/avg (Z3, Z4)) is less than 25% (for example, 22%, 20%, 18%, 15%, 12%, 10%, or less). In some embodiments, the difference between X1 and X2 divided by the average value of X1 and X2 may range from 15% to 20%. That is, a relative percent difference between a density of the fillers in the first portion 335 and a density of the fillers in the second portion 337 (based on volume or area) is less than 25% (for example, 22%, 20%, 18%, 15%, 12%, 10%, or less) and may range from 15% to 20% in some embodiment. Moreover, a size of the filler which is adjacent to the upper surface 331 of the encapsulant 33 is greater than a size of the filler which is far away from the upper surface 331 of the encapsulant 33. In some embodiments, the encapsulant 33 further includes a third portion 338 and a fourth portion 339. The third portion 338 is adjacent to the upper surface 331 of the encapsulant 33 and the fourth portion 339 is far away from the upper surface 331 of the encapsulant 33. Thus, a distance between the upper surface 331 and the third portion 338 is smaller than a distance between the upper surface 331 and the fourth portion 339. An average size of the fillers in the third portion 338 is greater than an average size of the fillers in the fourth portion 339.

Referring to FIG. 3A, a portion of the side surface 322, the lower surface 324 and the side surface 326 of the conductive element 32 are encapsulated by the encapsulant 33. The upper surface 321 and the side surface 328 of the conductive element 32 are exposed from the encapsulant 33 and contact the shielding layer 34. In some embodiments, a roughness of the upper surface 321 of the conductive element 32 is greater than a roughness of the side surface 322 of the conductive element 32. In some embodiments, the roughness of the upper surface 321 of the conductive element 32 is greater than a roughness of the lower surface 324 of the conductive element 32. In some embodiments, the upper surface 321 of the conductive element 32 is greater than a roughness of the side surface 326 of the conductive element 32. In some embodiments, the upper surface 321 of the conductive element 32 is greater than a roughness of the side surface 328 of the conductive element 32.

Figure 3B:
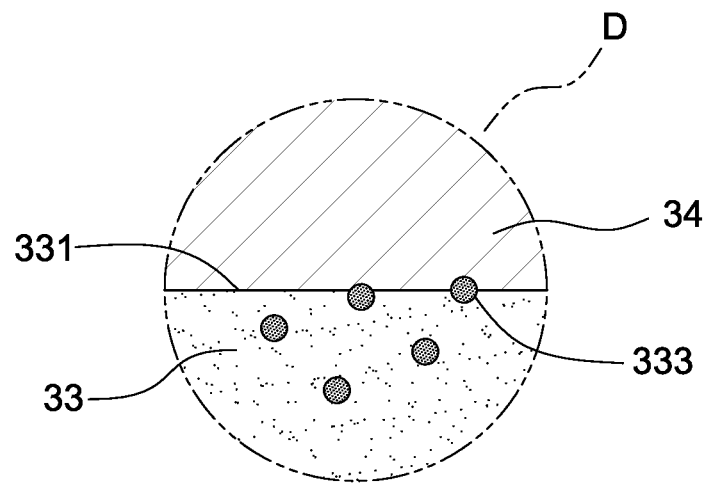
FIG. 3B is an enlarged view of portion "D" illustrated in FIG. 3A.

FIG. 3B is an enlarged view of portion "D" illustrated in FIG. 3A. As shown in FIG. 3B, the shielding layer 34 covers the encapsulant 33. Thus, the shielding layer 34 may be attached to the upper surface 331 of the encapsulant 33. In some embodiments, the encapsulant 33 includes a filler 333 protruding from an upper surface 331 of the encapsulant 33 and extending into the shielding layer 34.

Figure 3C:
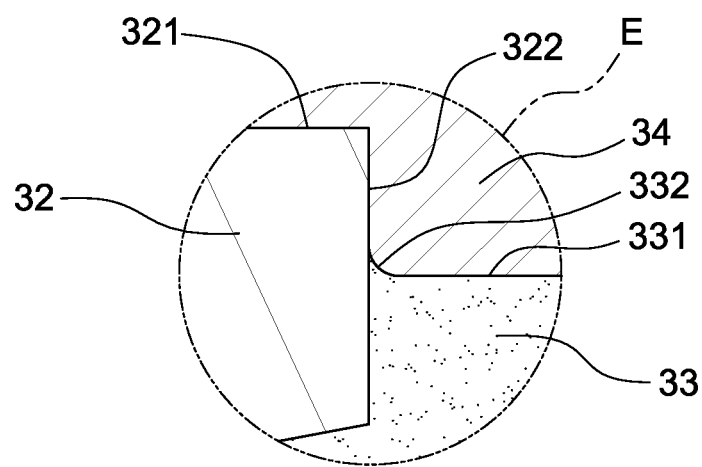
FIG. 3C is an enlarged view of portion "E" illustrated in FIG. 3A.

FIG. 3C is an enlarged view of portion "E" illustrated in FIG. 3A. In some embodiments, the upper surface 331 of the encapsulant 33 has a curved surface 332 adjacent to and connecting to the side surface 322 of the conductive element 32.

FIG. 4A, FIG. 4B, FIG. 4C, FIG. 4D, FIG. 4E, FIG. 4F, FIG. 4G and FIG. 4H illustrate a method for manufacturing a semiconductor device package 3 in accordance with some embodiments of the present disclosure.

Figure 4A:
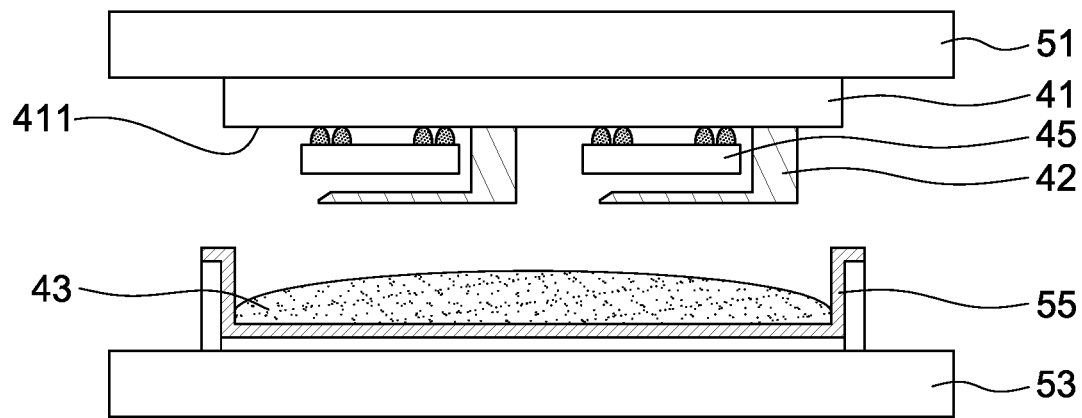
FIG. 4A, FIG. 4B, FIG. 4C, FIG. 4D, FIG. 4E, FIG. 4F, FIG. 4G and FIG. 4H illustrate a method for manufacturing a semiconductor device package in accordance with some embodiments of the present disclosure.

Referring to FIG. 4A, a number of the semiconductor devices 45 and a number of the conductive elements 42 are disposed on a surface 411 of a substrate 41. The substrate 41 is then mounted on a top mold chase 41. The bottom mold chase 43 defines a space for accommodating the semiconductor devices 45 and the conductive elements 42. A release film 55 is disposed on the bottom mold chase 43 and within the space defined by the bottom mold chase 43. In some embodiments, the release film 55 is disposed on a bottom of the space. In some embodiments, the release film 55 is disposed on a bottom of the space and surrounds the periphery of the space. The liquid encapsulant 43 is received in the space of the bottom mold chase 53 and on the release film 55.

Figure 4B:
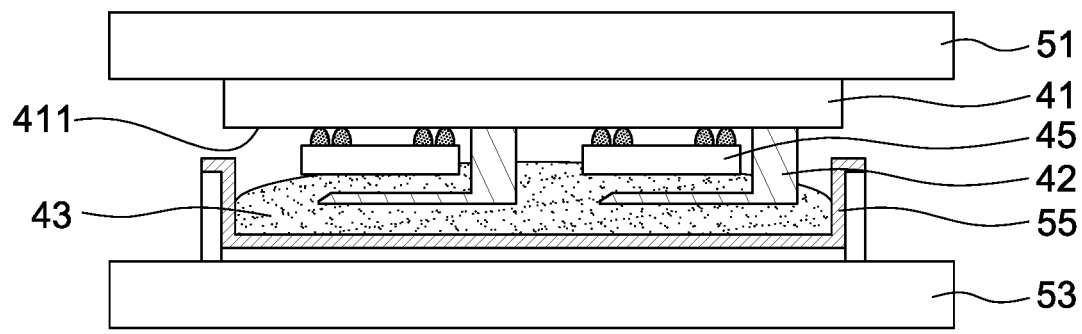

Referring to FIG. 4B, the top mold chase 51 and the bottom mold chase 53 are moved to be close to each other such that the substrate 41, the conductive elements 42 and the semiconductor devices 45 are pushed into the liquid encapsulant 43.

Figure 4C:
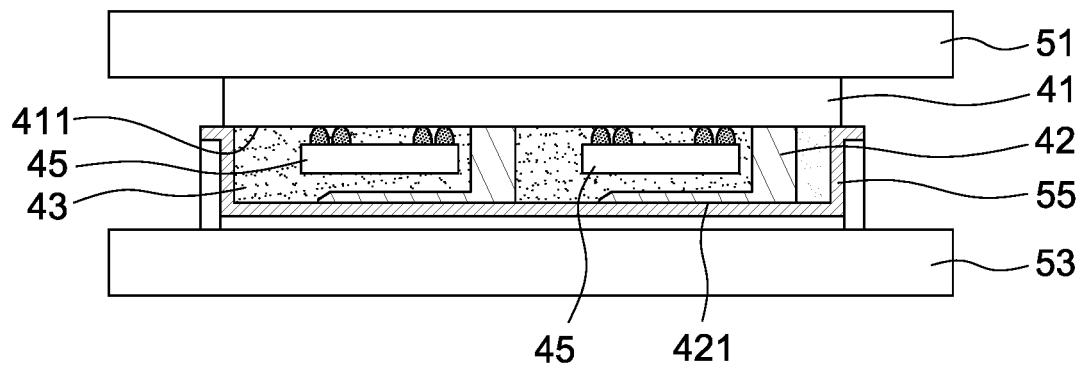

Referring to FIG. 4C, when the top mold chase 51 mates with the bottom mold chase 53, the surface 411 of the substrate 41, the conductive elements 42 and the semiconductor devices 45 are covered by the liquid encapsulant 43. Upper surfaces 421 of the conductive elements 42 may contact the release film 55. In some embodiments, the upper surfaces 421 of the conductive elements 42 may be pushed into the release film 55. That is, the upper surfaces 421 of the conductive elements 42 may be sunk into the release film 55. Therefore, the upper surfaces 421 of the conductive element 42 are not covered by the liquid encapsulant 43.

Figure 4D:
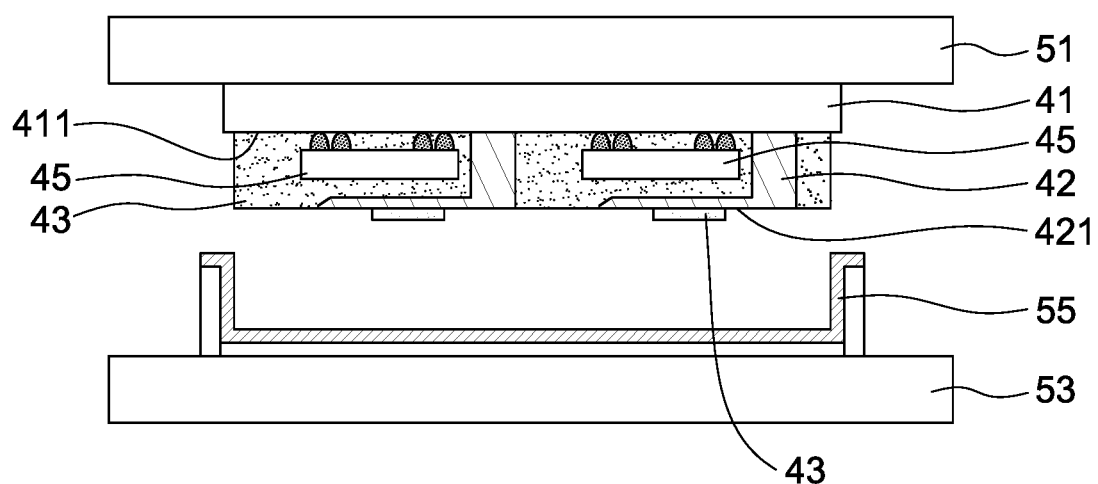

Referring to FIG. 4D, after the liquid encapsulant 43 is cured to harden, and the top mold chase 51 and the bottom mold chase 53 are moved away from each other. The substrate 41, the conductive elements 42, the semiconductor devices 45 and the encapsulant 43 are joined together and moved with the top mold chase 51. That is, the conductive elements 42 and the encapsulant 43 are separated from the release film 55. As shown in FIG. 4D, the surface 411 of the substrate 41, the conductive elements 42, and the semiconductor devices 45 are encapsulated by the encapsulant 43, and the upper surfaces 421 of the conductive elements 42 are exposed from the encapsulant 43. In some embodiments, some residues of the encapsulant 43 may remain on the upper surfaces 421 of the conductive elements 42.

Figure 4E:
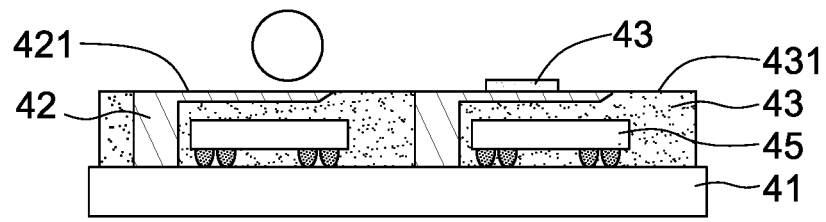

Referring to FIG. 4E, in the case that some residues of the encapsulant 43 remain on the upper surfaces 421 of the conductive elements 4, a surface finishing process may be performed to remove the residues of the encapsulant 43. In some embodiments, the residues of the encapsulant 43 remaining on the upper surfaces 421 of the conductive elements 42 are removed by grinding. In some embodiments, residues of the encapsulant 43 remaining on the upper surfaces 421 of the conductive elements 42 are removed by a plasma etching process. During the surface finishing process, the upper surface 431 of the encapsulant 43 will not be ground or etched. Therefore, the encapsulant 43 may have some fillers protruding from the upper surface 431 of the encapsulant 43.

Figure 4F:
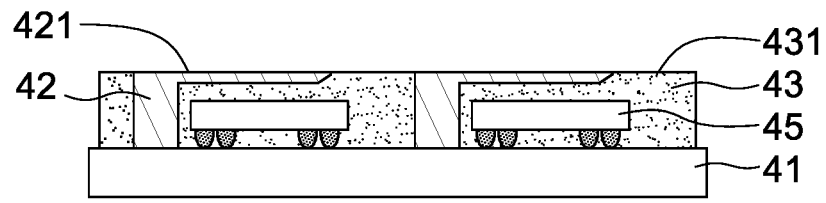

Referring to FIG. 4F, after the surface finishing process, there is no residues of encapsulant 43 remaining on the upper surfaces 421 of the conductive elements 42. Further, since the upper surface 421 of the conductive element 42 has been ground or etched, the upper surface 421 of the conductive element 42 is rougher than a surface of the conductive element 42 which has not been ground or etched.

Figure 4G:
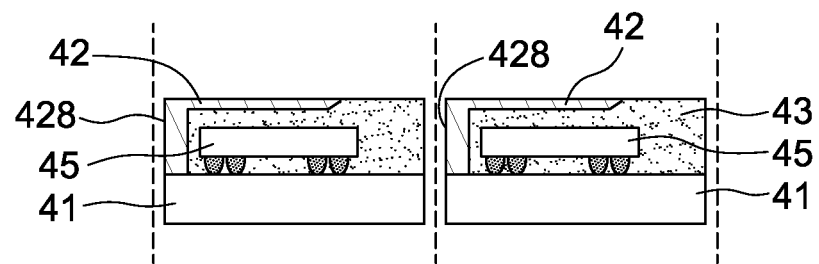

Referring to FIG. 4G, a singulation process is performed by cutting through the encapsulant 43 and the substrate 41. The singulation may be performed, for example, by using a dicing saw, laser or other appropriate cutting technique. In some embodiments, a side surface 428 of the conductive element 42 may be exposed after the singulation. In some embodiments, the conductive element 42 is a petition separating neighboring compartments, each of the compartments may include one or more semiconductor devices 45 encapsulated by the encapsulant 43 and after the singulation a side surface of encapsulant 43 may be exposed.

Figure 4H:
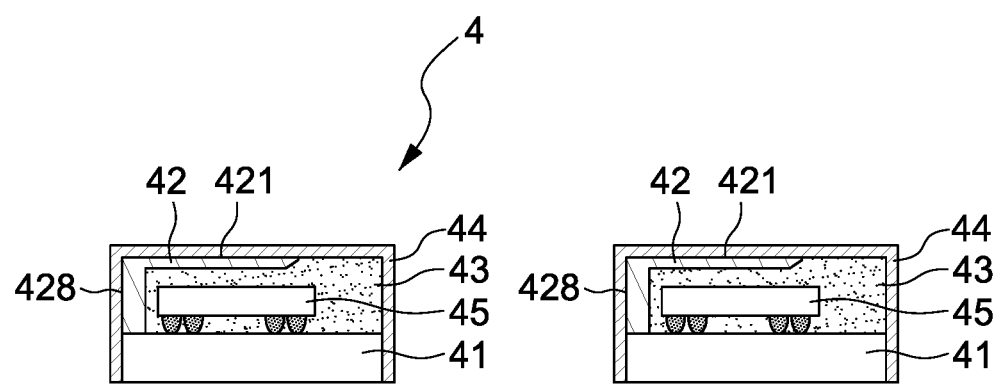

Referring to FIG. 4H, a shielding layer 44 is formed. In some embodiments, the shielding layer 44 may cover the encapsulant 43 and the conductive element 42. In some embodiment, the shielding layer 44 contacts the side surface 428 and the upper surface 421 of the conductive element 42. In addition, the encapsulant 43 may have some fillers extending into the shielding layer 44 since the shielding layer 44 is directly disposed on the upper surface 421 of the encapsulant 41.

After the manufacturing process as shown in FIG. 4A, FIG. 4B, FIG. 4C, FIG. 4D, FIG. 4E, FIG. 4F, FIG. 4G and FIG. 4H, the semiconductor device package 4 is formed (see FIG. 4H). In some embodiments, the semiconductor device package 4 is the same as, or similar to, the semiconductor device package 1 shown in FIG. 1A. In some embodiments, the semiconductor device package 4 is the same as, or similar to, the semiconductor device package 3 shown in FIG. 3A if the upper surface 421 of the conductive element 42 is sunk into the release film 55 during the process as shown in FIG. 4C. Further, since the upper surface 421 of the conductive element 42 may be sunk into the release film 55 during the process as shown in FIG. 4C, in some embodiments, the semiconductor device package 4 is the same as, or similar to, the semiconductor device package 3 shown in FIG. 3C that the upper surface 431 of the encapsulant 43 has a curved surface adjacent to the conductive element 42.

In comparative examples, the molding compound is applied to cover the whole device (i.e., including the upper surface of the lid) by compression molding, laser is used to groove the molding compound to expose at least a portion of the upper surface of the lid, and then a shielding layer is formed thereon and connected to the exposed portion of the upper surface of the lid. However, the groove formed by laser grooving may not accurately align with the lid. Further, the size of the package cannot be minimized.

Unlike the comparative examples, in the embodiments in accordance with the present disclosure, the upper surface 421 of the conductive elements 42 (e.g., a lid) may contact the release film 55 or may be further pushed into the release film 55 during the operation of applying molding compound as illustrated in FIG. 4C, less molding compound is needed. In addition, an upper surface 421 of the conductive element 42 may be at the same height as an upper surface 431 of the encapsulant 43 formed of the molding compound or at a height greater than that of the upper surface 431 of the encapsulant 43. Although few residues of the encapsulant 43 may remain on the upper surface 421 of the conductive element 42, they can be easily removed by, for example, grinding or plasma etching. Therefore, a shielding layer can be further formed on encapsulant 43 and connects to the upper surface 421 of the conductive element 42 without the operation of laser grooving and the alignment issue in the comparative examples can be avoided. As a result, the size of package can be further reduced, and the yield can be increased.

Figure 5:
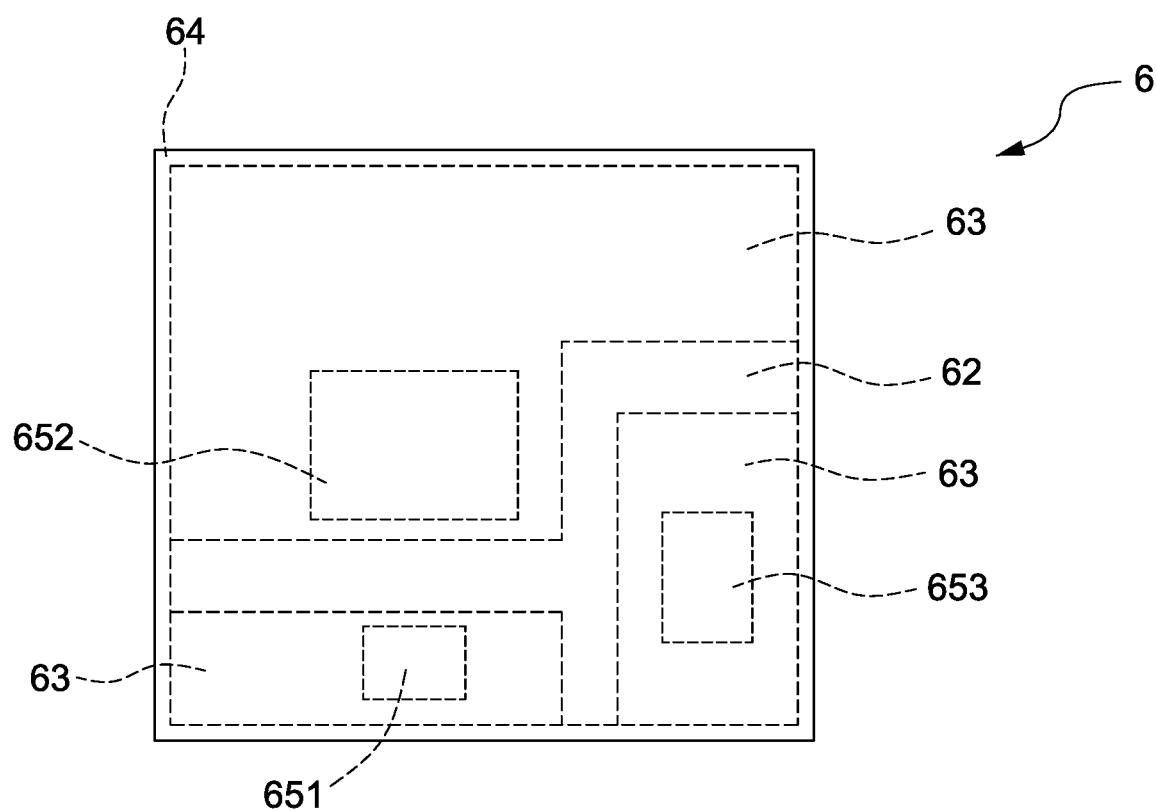
FIG. 5 is a top view of a semiconductor device package in accordance with some embodiments of the present disclosure.

FIG. 5 is a top view of a semiconductor device package 6 in accordance with some embodiments of the present disclosure. The semiconductor device package 6 may have a structure similar to that of the semiconductor device package 1 of FIG. 1A, the semiconductor device package 2 of FIG. 2 or the semiconductor device package 3 of FIG. 3A. Referring to FIG. 5, the semiconductor device package 6 includes an encapsulant 63 encapsulating semiconductor devices 651, 652 and 653 and a conductive element 62. An upper surface of the conductive element 62 is exposed from the encapsulant 63. Further, a shielding layer 64 covers the encapsulant 63 and the conductive element 62. As shown in FIG. 5, the conductive element 62 separates the semiconductor devices 651, 652 and 653 into different compartments and functions as a fence or barrier so as to reduce electromagnetic interference (EMI) among the semiconductor devices 651, 652 and 653.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A semiconductor package structure, comprising:
   a conductive element having a lateral surface;
   an encapsulant covering the conductive element; and
   a shielding layer covering the encapsulant and the conductive element and having a first lower surface;
   wherein a recess is defined by the first lower surface of the shielding layer and the lateral surface of the conductive element;
   wherein the shielding layer further comprises:
      a first portion disposed over an upper surface of the encapsulant; and
      a second portion disposed adjacent to a lateral surface of the encapsulant;
      wherein a thickness of the first portion is different from a thickness of the second portion.

2. The semiconductor package structure of claim 1, wherein a portion of the encapsulant is arranged within the recess.

3. The semiconductor package structure of claim 2, wherein the portion of the encapsulant is tapered toward an upper surface of the conductive element.

4. A semiconductor package structure, comprising:
   a conductive element having a lateral surface;
   an encapsulant covering the conductive element; and
   a shielding layer covering the encapsulant and the conductive element and having a first lower surface;
   wherein a recess is defined by the first lower surface of the shielding layer and the lateral surface of the conductive element;
   wherein the shielding layer has a curved surface connected to the first lower surface of the shielding layer to the lateral surface of the conductive element.

5. The semiconductor package structure of claim 1, wherein the shielding layer has a second lower surface in contact with an upper surface of the conductive element, and wherein an elevation of the second lower surface of the shielding layer is higher than an elevation of the first lower surface of the shielding layer.

6. The semiconductor package structure of claim 1, further comprising a substrate disposed under the encapsulant, wherein the second portion of the shielding layer is disposed adjacent to a lateral surface of the substrate.

7. The semiconductor package structure of claim 1, further comprising a first electronic component and a second electronic component, wherein the first electronic component and the second electronic component are located at two opposite sides of the conductive element.

8. The semiconductor package structure of claim 1, further comprising a substrate disposed under the conductive element and having a surface, wherein the encapsulant has a top surface facing away from the surface of the substrate, and wherein an elevation of a portion of the conductive element is higher than an elevation of the top surface of the encapsulant with respect to the substrate.

9. The semiconductor package structure of claim 8, wherein the shielding layer connects the lateral surface of the conductive element.

* * * * *